United States Patent
Yokoyama et al.

(10) Patent No.: US 7,978,025 B2
(45) Date of Patent: Jul. 12, 2011

(54) FILM BULK ACOUSTIC RESONATOR, FILTER, COMMUNICATION MODULE AND COMMUNICATION DEVICE

(75) Inventors: Tsuyoshi Yokoyama, Kawasaki (JP); Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 206 days.

(21) Appl. No.: 12/350,598

(22) Filed: Jan. 8, 2009

(65) Prior Publication Data
US 2010/0019864 A1 Jan. 28, 2010

(30) Foreign Application Priority Data
Feb. 15, 2008 (JP) ................. 2008-034670

(51) Int. Cl.
*H03H 9/54* (2006.01)
*H03H 9/70* (2006.01)
(52) U.S. Cl. ......... 333/133; 333/187; 333/189; 310/322
(58) Field of Classification Search .................. 333/187, 333/189, 133; 310/322, 324, 326
See application file for complete search history.

(56) References Cited

U.S. PATENT DOCUMENTS

| | | | | |
|---|---|---|---|---|
| 6,150,703 A | * | 11/2000 | Cushman et al. | 257/415 |
| 6,215,375 B1 | * | 4/2001 | Larson et al. | 333/187 |
| 6,486,751 B1 | * | 11/2002 | Barber et al. | 333/187 |
| 6,927,649 B2 | * | 8/2005 | Metzger et al. | 333/133 |
| 7,173,361 B2 | * | 2/2007 | Saito et al. | 310/320 |
| 7,221,242 B2 | * | 5/2007 | Asai et al. | 333/187 |
| 7,321,183 B2 | * | 1/2008 | Ebuchi et al. | 310/324 |
| 7,369,013 B2 | * | 5/2008 | Fazzio et al. | 333/187 |
| 7,554,427 B2 | * | 6/2009 | Matsumoto et al. | 333/187 |
| 2006/0176126 A1 | * | 8/2006 | Wang et al. | 333/187 |
| 2007/0096597 A1 | * | 5/2007 | Taniguchi et al. | 310/320 |
| 2009/0153268 A1 | * | 6/2009 | Milsom et al. | 333/187 |

FOREIGN PATENT DOCUMENTS

| | | |
|---|---|---|
| CN | 1956324 A | 5/2006 |
| JP | 2005-151353 A | 6/2005 |
| JP | 2005-303573 | * 10/2005 |
| JP | 2006-186412 | * 7/2006 |

OTHER PUBLICATIONS

English language machine translation of JP 2005-303573, pp. 1-15, published Oct. 27, 2005.*
English language Derwent abstract of JP 2005-303573, pp. 1-2, published Oct. 27, 2005.*
Chinese patent application No. 200910003011.4 and its translation, Dec. 8, 2010.

* cited by examiner

*Primary Examiner* — Barbara Summons
(74) *Attorney, Agent, or Firm* — Arent Fox LLP

(57) ABSTRACT

There is provided a film bulk acoustic resonator which has a substrate, a lower electrode formed on the substrate, a piezoelectric membrane formed on the lower electrode, an upper electrode formed on the piezoelectric membrane, and an insulating film disposed adjacent to the piezoelectric membrane between the upper electrode and the substrate and at a position at which the upper electrode and the substrate are opposed each other. The substrate is preferably formed so as to form a void at a portion facing to the lower electrode. The lower electrode has preferably a tapered end and a part of the boundary between the piezoelectric membrane and the insulating film is disposed on an inside from the upper end of the tapered end.

15 Claims, 16 Drawing Sheets

FILM BULK ACOUSTIC RESONATOR, FILTER, COMMUNICATION MODULE AND COMMUNICATION DEVICE

BACKGROUND OF THE INVENTION

1. Field of the Invention

The present invention relates to a film bulk acoustic resonator and to a filter, a communication module and a communication device using the film bulk acoustic resonator.

2. Description of the Related Art

With the rapid spread of wireless applications typified by mobile-phone units, the demand on high performance filters and duplexers is now increasing. Filters and duplexers using a film bulk acoustic resonator (FBAR) are gaining attention as filters and duplexers of the next generation, replacing with surface acoustic wave filters, because they bring about low-loss and high withstand electric power characteristics specifically in high frequencies. A main reason why the film bulk acoustic resonator filter essentially has the low-loss and high withstand power characteristics is because the resonator has a simple structure and can avoid drop of the characteristics due to an increase of electric resistance because it can assure an electrode size even if frequency is increased. However, performances of the surface acoustic wave filter are being remarkably improved lately. Therefore it has become essential to improve the performances of the filter using the film bulk acoustic resonator further and to lower the low-loss characteristics in particular to build up its competitiveness. By being influenced by such background, developments for lowering the low-loss characteristics of the film bulk acoustic resonator further are now actively promoted.

SUMMARY

An object of the invention is to provide a film bulk acoustic resonator, a filter, a communication module and a communication device capable of suppressing the lateral leak and lowering the loss.

According to one aspect of the present invention, a film bulk acoustic resonator includes a substrate, a lower electrode formed on the substrate, a piezoelectric membrane formed on the lower electrode, an upper electrode formed on the piezoelectric membrane, and an insulating film disposed adjacent to the piezoelectric membrane between the upper electrode and the substrate and at a position at which the upper electrode and the substrate are opposed each other.

DESCRIPTION OF THE PREFERRED EMBODIMENTS

One of inhibition of suppressing the lateral leak and lowering the loss of loss of the film bulk acoustic resonator filter is a phenomenon that acoustic waves leak to outside (referred to as a non-resonating section hereinafter) of a region (referred to as a resonating section hereinafter) where an upper electrode faces with a lower electrode, i.e., to a region where they cannot be reconverted into electrical signals, and are lost. Here, this phenomenon will be called as a "lateral leak." The cause of the lateral leak is originated from a relationship of magnitudes of sound speed in the resonating section and the non-resonating section. The relationship of magnitudes of sound speed not causing the lateral leak is determined by a Poisson's ratio of a piezoelectric membrane to be used. If the Poisson's ratio is ⅓ or more, the sound speed in the resonating section is slower than that in the non-resonating section and if the Poisson's ratio is ⅓ or less, the sound speed in the resonating section is faster than that in the non-resonating section. In a case of a piezoelectric membrane whose Poisson's ratio is ⅓ or more, the sound speed in the resonating section becomes slower than that of a peripheral part by applying adequate mass addition to the resonating section and the lateral leak may be suppressed relatively easily. When the Poisson's ratio of the piezoelectric membrane is ⅓ or less in contrary, increasing the sound speed in the peripheral part is difficult, then the lateral leak may not be suppressed easily. Aluminum nitrate (AlN) whose Poisson's ratio is ⅓ or less is used as the piezoelectric membrane in the present practical film bulk acoustic resonator film, so that there have been problems that it is difficult to suppress the lateral leak and that the loss increase.

Figure 10A:
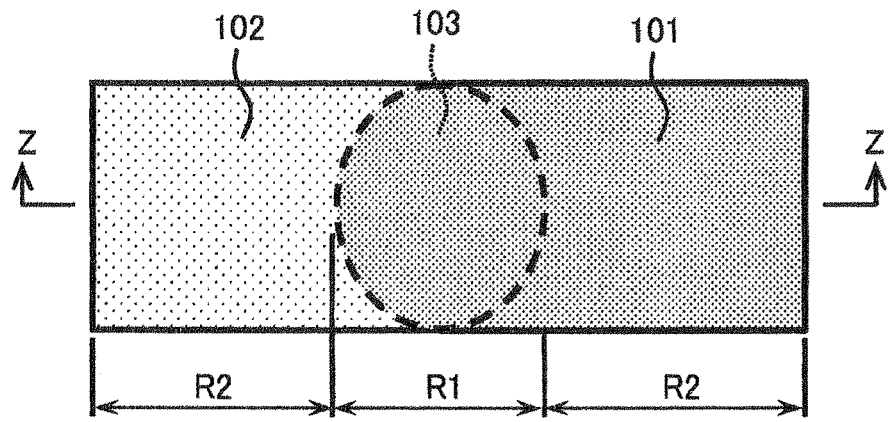
FIG. 10A shows a schematic diagram of a structure of a conventional film bulk acoustic resonator and FIG. 10B shows a cross-sectional view of the resonator along ZZ line shown in FIG. 10A.
Figure 10B:
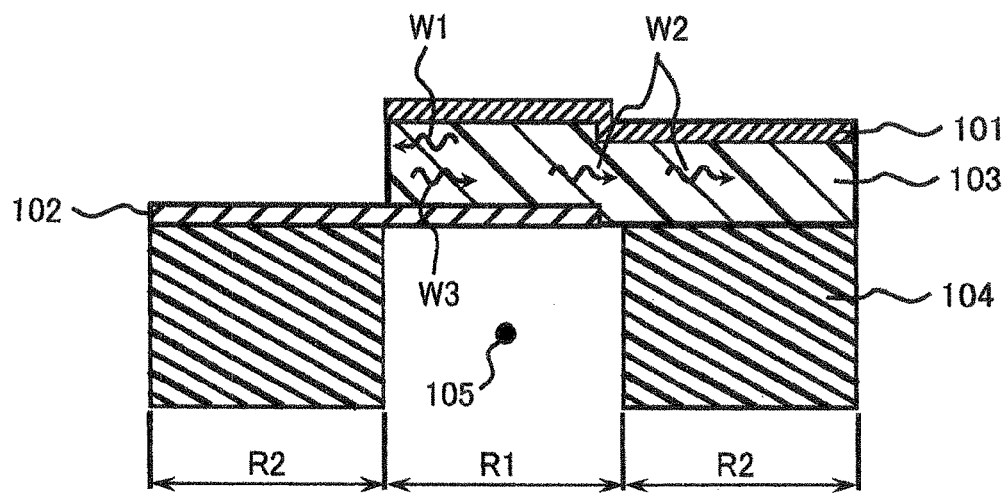

FIG. 10A shows a structure of a prior art piezoelectric bulk film resonator. As shown in FIG. 10A, the prior art piezoelectric bulk film resonator has a resonating section whose shape is oval. FIG. 10B is a section view of along a Z-Z section in FIG. 10A. As shown in FIG. 10B, the prior art piezoelectric bulk film resonator has an upper electrode 101 and a lower electrode 102 provided so as to sandwich a piezoelectric membrane 103 on a substrate 104.

Figure 11A:
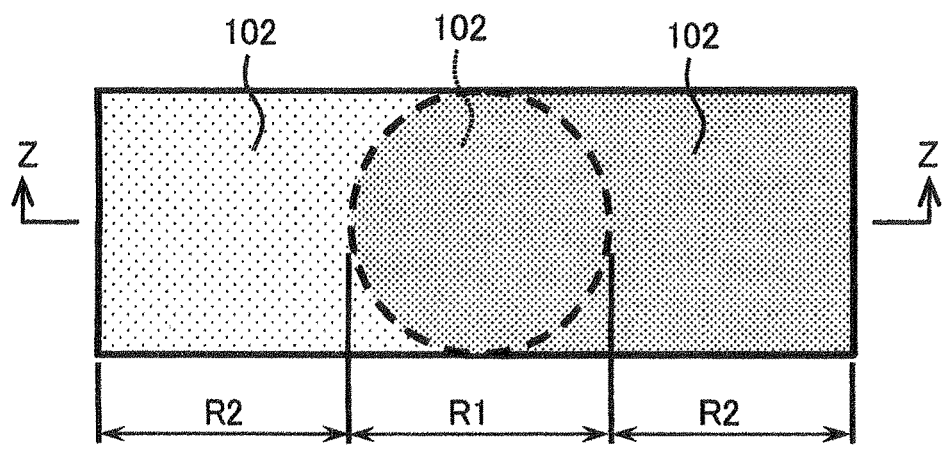
FIG. 11A shows a schematic diagram of a structure of a conventional film bulk acoustic resonator and FIG. 11B shows a cross-sectional view of the resonator along ZZ line shown in FIG. 11A.
Figure 11B:
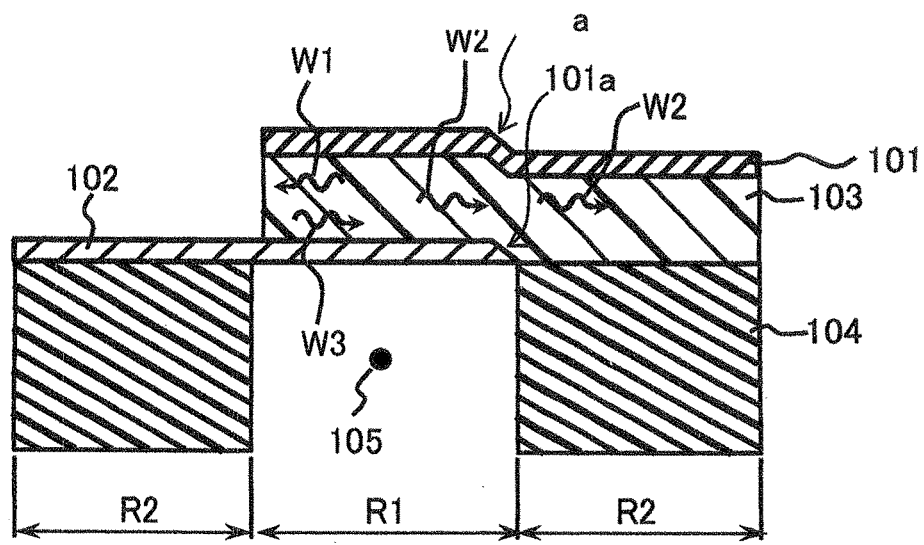

FIG. 11A shows another structure of a prior art shown in Japanese Laid-open Patent Publication No. 2005-151353. FIG. 11B is section view along a Z-Z section in FIG. 11A. The structure shown in FIG. 11B includes a tapered end 102a at an end of the lower electrode 102.

As shown in FIGS. 10A and 10B, when the magnitudes of sound speed in a resonating section R1 and a non-resonating section R2 are in a relation of causing the lateral leak, acoustic waves W1 generated in the piezoelectric membrane 103 are reflected at an end of the piezoelectric membrane 103 (reflected wave W3). The reflected wave W3 travels in the piezoelectric membrane 103 and then leaks in the lateral direction as a leakage acoustic wave W2 from the resonating section R1 to the non-resonating section R2. Generation of the leakage acoustic wave W2 increases the loss.

Still more, as shown in FIGS. 11A and 11B, the leakage acoustic wave W2 is generated and the loss increases in the same manner also when the tapered end 102a is formed at the end of the lower electrode 102. Further, a vibration mode (unnecessary mode) other than thickness vertical vibration, i.e., primary vibration, is generated by the piezoelectric membrane 103 at the tapered end 102a. Since the mechanical vibration in the unnecessary mode is reconverted into electrical vibration, the efficiency decreases.

EMBODIMENTS

1. Structure of Film Bulk Acoustic Resonator

Figure 1A:
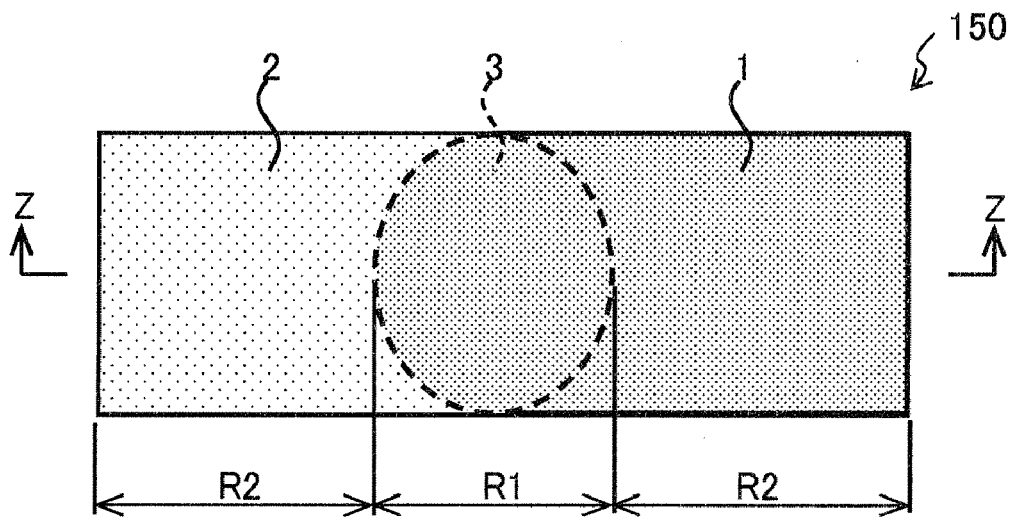
FIG. 1A shows a schematic plan view of the film bulk acoustic resonator according to the first embodiment and FIG. 1B shows a schematic cross-sectional view of the film bulk acoustic resonator along the line ZZ in FIG. 1A.
Figure 1B:
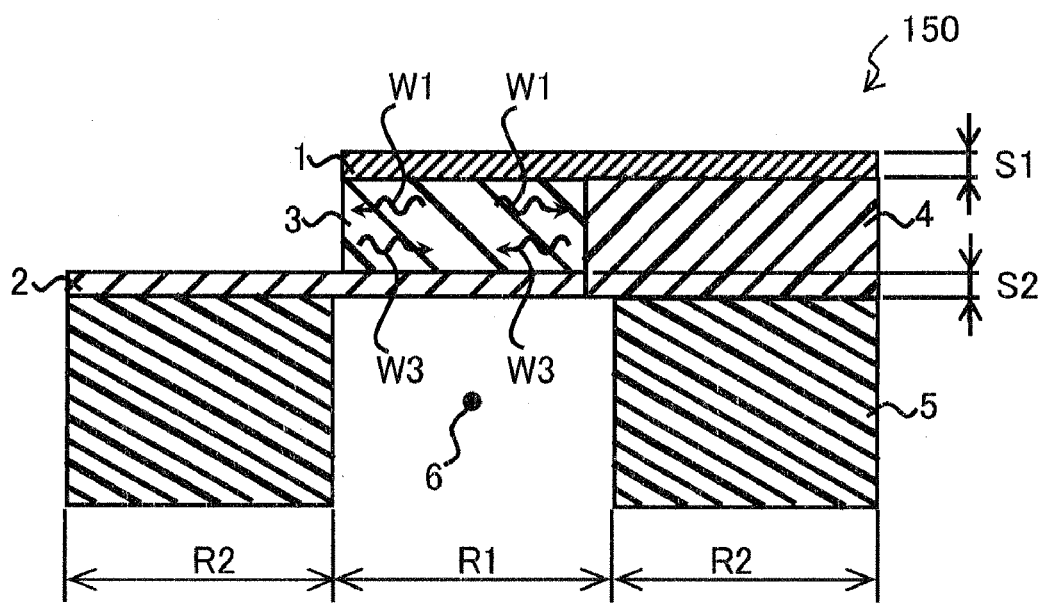

FIG. 1A shows a first structure of a film bulk acoustic resonator, the film bulk resonator herein after referred to the first film bulk resonator 150, according to the present embodiment. FIG. 1B shows a section along a Z-Z in FIG. 1A. As shown in FIGS. 1A and 1B, upper and lower electrodes 1 and 2 are formed so as to sandwich a lower electrode 2 on a substrate 5 in the film bulk acoustic resonator. The lower electrode 2 is formed on the substrate 5 and arranged on a void 6. The piezoelectric membrane 3 is formed at position overlapping with the void 6 on a plane of projection. An insulating film 4 is formed between the upper electrode 1 and the substrate 5 in a region where the piezoelectric membrane 3 is not formed. The present embodiment is mainly characterized in that the insulating film 4 is formed.

The first film bulk acoustic resonator 150 can reduce an occurrence of leakage acoustic wave. In concrete, the piezoelectric membrane 3 is formed preferably only in a resonating section R1 (above the void 6) by removing the piezoelectric membrane 3 in a non-resonating section R2 (above the substrate 5) by patterning. Since the resonating section R1 has a structure in which acoustic waves are reflected between the upper electrode 1 and the lower electrode 2, the acoustic waves efficiently reflect by the void 6.

Still more, the insulating film 4 may be formed in part of the region from which the piezoelectric membrane 3 has been removed. Owing to such structure in which the piezoelectric membrane 3 exists only in the resonating section R1, the lateral leak of the acoustic wave W1 to the non-resonating section R2 is reduced. Therefore, the drop of efficiency in reconverting mechanical vibrations caused by lateral leak into electrical signals is reduced. Thus the loss may be reduced.

Further, removing the piezoelectric membrane 3 requires the upper electrode 1 to overcome a difference of step of a total thickness of the piezoelectric membrane 3 and the lower electrode 2. Since a thickness of the upper electrode 1 is normally thinner than the total thickness of the piezoelectric membrane 3 and the lower electrode 2, the upper electrode 1 tends to be disconnected just by removing the piezoelectric membrane 3. Then, it becomes possible to prevent the upper electrode 1 from being disconnected by forming the insulating film 4 in the part where the piezoelectric membrane 3 has been removed to eliminate or reduce the difference of step in the upper electrode 1.

It is also preferable for prevention of disconnecting the upper electrode 1 to reduce a difference S2 of step between the piezoelectric membrane 3 and the insulating film 4 to a difference thinner than the thickness S1 of the upper electrode 1. Because the reduction of the difference S2 results in a reduction of step between both surfaces of the piezoelectric membrane 3 and the insulating film 4, the individual surfaces facing the upper electrode 1 may be reduced.

Even if the insulating film 4 is formed around the piezoelectric membrane 3, the acoustic wave W1 barely propagates into the insulating film 4 because the insulating film 4 has no or slight piezoelectricity, thus preventing the lateral leak of the acoustic wave W1.

Figure 2A:
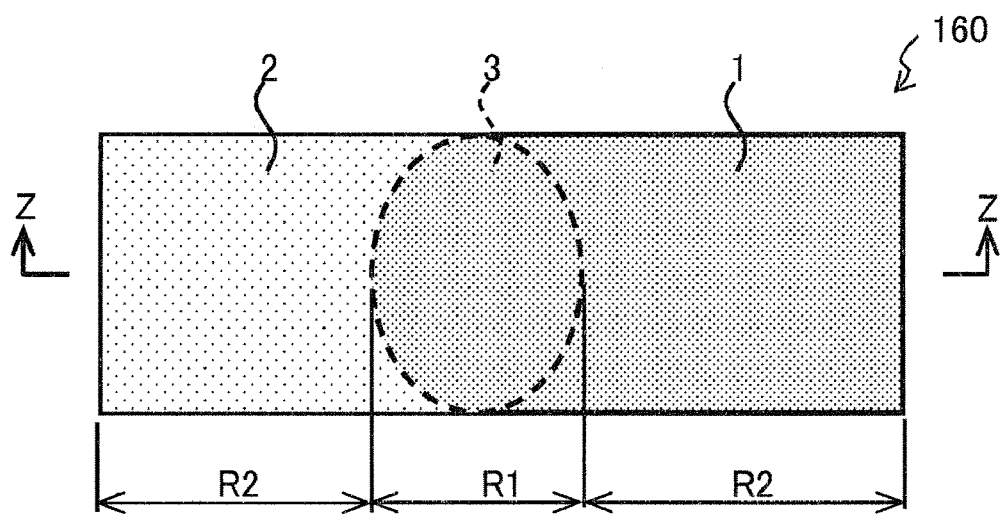
FIG. 2A shows a schematic plan view of the film bulk acoustic resonator according to the second embodiment and FIG. 2B shows a schematic cross-sectional view of the film bulk acoustic resonator along the line ZZ in FIG. 2A.
Figure 2B:
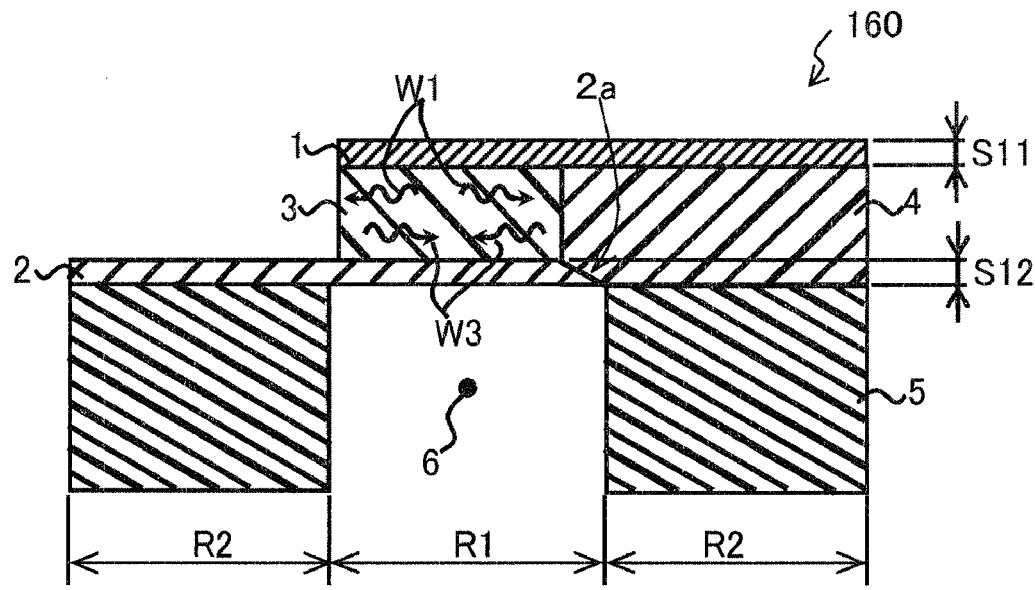

FIG. 2A shows a second structure of the film bulk acoustic resonator, the film bulk resonator herein after referred to the second film bulk resonator 160, according to the present embodiment. FIG. 2B shows a section view along a line Z-Z in FIG. 2A. It is noted that the same structures with the structures shown in FIGS. 1A and 1B are denoted by the same reference numerals and their detailed explanation will be omitted in FIGS. 2A and 2B. One of characteristics of the second film bulk acoustic resonator 160 is in that a tapered end 2a is formed at an end of the lower electrode 2.

In the second film bulk acoustic resonator 160, a boundary between the piezoelectric membrane 3 and the insulating film 4 is formed on the upper surface of the lower electrode 2, specifically the boundary is formed on the upper surface of the lower electrode 2 apart from an upper end of the tapered end 2a as shown in FIG. 2B. By virtue of the structure, the lateral leak of the acoustic wave W1 is reduced without an influence of the piezoelectric membrane 3 that grows obliquely along the tapered end 2a.

Still more, constructing as described above allows to prevent the drop of the efficiency in reconverting the mechanical vibrations into electrical vibrations that has been otherwise caused by the vibration mode generated other than the thickness vertical vibrations, i.e., the primary vibrations.

Further, it is possible to prevent the upper electrode 1 from being disconnected by reducing a difference of step S12 between the piezoelectric membrane 3 and the insulating film 4 formed around the piezoelectric membrane 3 to be smaller than the thickness S11 of the upper electrode 1.

Next, materials of the insulating film 4 will be explained. Table 1 shows resonance Q (quality factor), anti-resonance Q and electromechanical coupling coefficient k2 when silicon oxide (SiO2), silicon nitride (Si3N4), silicon carbide (SiC), aluminum oxide (Al2O3) and aluminum nitride (AlN) are used as the material of the insulating film. It is noted that AlN is a prior art insulating film.

TABLE 1

| Material of the insulating film | Resonance Q | Anti-resonance Q | Electro-mechanical coupling coefficient k2 (%) |
|---|---|---|---|
| SiO$_2$ | 740 | 865 | 6.33 |
| Si$_3$N$_4$ | 750 | 500 | 6.36 |
| SiC | 750 | 500 | 6.36 |
| Al$_2$O$_3$ | 750 | 490 | 6.36 |
| AlN | 740 | 400 | 6.15 |

It is possible to improve the anti-resonance Q and the electro-mechanical coupling coefficients k2 by forming the lower electrode 2 with either one of SiO2, Si3N4, SiC and Al2O3 when compared to the insulating material of AlN of the prior art. It is noted that the insulating film 4 may be formed of materials other than those shown in (Table 1) if the material has at least no or slight piezoelectricity. It is also possible to cut a fabrication cost and to form an inexpensive film bulk acoustic resonator by forming the insulating film 4 by an application method of SOG (Spin-On Glass) by using SiO2 among the materials shown in Table 1.

Next, materials of the piezoelectric membrane 3 will be explained. One of advantages of to be attained by the embodiments of the invention is to prevent the lateral leak of the acoustic wave W1. The cause of the lateral leak is originated by the relationship of magnitudes of sound speed in the resonating section R1 and the non-resonating section R2. The relationship of magnitudes of sound speed not causing the lateral leak is determined by a Poisson's ratio of the piezoelectric membrane 3 to be used. If the Poisson's ratio is ⅓ or more, the sound speed in the resonating section R1 is slower than that of the non-resonating section R2 and if the Poisson's ratio is ⅓ or less, the sound speed in the resonating section R1 is faster than that in the non-resonating section R2. Here, in a case of the piezoelectric membrane 3 whose Poisson's ratio is ⅓ or more, the sound speed becomes slower than that of a peripheral part by applying adequate mass addition to the resonating section R1. Thus, the lateral leak may be suppressed relatively easily. When the Poisson's ratio of the piezoelectric membrane 3 is ⅓ or less in contrary, the relationship of the sound speed causing no lateral leak is reversed and the lateral leak may not be suppressed easily. Accordingly, AlN for example is a practical material whose effect is large when the Poisson's ratio of the piezoelectric membrane 3 is ⅓ or less as what can suppress the lateral leak by using the structure of the film bulk acoustic resonator of the embodiments of the invention.

Next, an area on which the piezoelectric membrane 3 is formed will be explained. At first, the piezoelectric membrane 3 is formed preferably on an area smaller than that of a portion at which the upper and lower electrodes 1 and 2 face each other or one of electrodes is projected. In more detail, the area corresponds to an area of portion at which the piezoelectric membrane 3 contacts either the upper or lower electrodes 1. By this relationship between the piezoelectric membrane 3 and the upper and lower electrodes 1 and 2, the acoustic wave W1 is prevented from the lateral leakage into the non-resonating section R2.

Further, a portion on which the piezoelectric membrane 3 is preferably within a portion of the void 6 in a same direction of a plan view shown in FIGS. 1A and 2A. Since the piezoelectric membrane 3 and the void 6 are arranged in this relationship of portion, the membrane 3 may be able to vibrate freely, the film bulk acoustic resonator 150 and 160 have favorable characteristics.

Next, acoustic waves (reflected waves W3) reflected from the end of the patterned piezoelectric membrane 3 will be considered. As shown in FIG. 1B, the most of the acoustic waves W1 is reflected at the end of the patterned piezoelectric membrane 3 and generates the reflected waves W3. This reflected wave W3 is confined within the resonating section R1 because there is no lateral leak. Then, when this reflected wave W3 stays as a lateral standing wave within the resonating section R1, it generates ripples within a pass band, possibly causing a problem in terms of its application. It is possible to avoid the problem of the reflected wave W3 by forming the resonating section R1 where the upper electrode 1 faces to the lower electrode 2 into an oval shape or an irregular polygonal shape. It is because the lateral resonance condition is not met and the lateral standing wave hardly exists within the resonating section R1 since no parallel two sides exist by forming the resonating section R1 into the oval or irregular polygonal shape.

Next, electrode materials of the upper and lower electrodes 1 and 2 will be explained. It becomes necessary to use an electrode material whose acoustic impedance is high in order to confine acoustic waves in the thickness direction of the resonating section R1. If the thickness vertical vibration generated within the piezoelectric membrane 3 is sandwiched by an electrode material whose acoustic impedance is low, the vibration leaks into the electrode material. Therefore, even if the structure of the film bulk acoustic resonator preventing the lateral leak of the embodiments is adopted, its effect fades away. Accordingly, it is preferable to use either one of molybdenum (Mo), tungsten (W), ruthenium (Ru), rhodium (Rh), iridium (Ir) and platinum (Pt) as a material for forming the upper and lower electrodes 1 and 2.

2. Method for Fabricating Film Bulk Acoustic Resonator

Figure 3A:
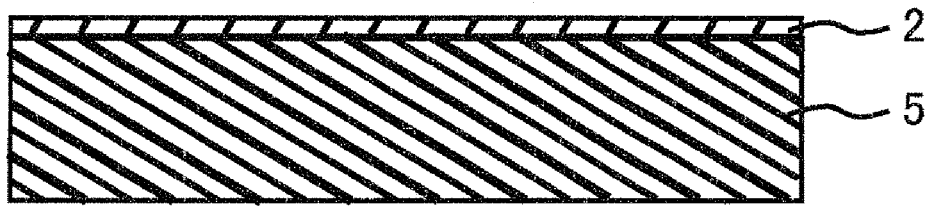
FIGS. 3A to 3N show a schematic manufacturing process of the film bulk acoustic resonator according the second embodiment shown in FIGS. 2A and 2B.

A method for fabricating the film bulk acoustic resonator of the embodiment will be explained. The effect of the embodiments of the invention was verified by using the substrate 5 made of Si, the upper and lower electrodes 1 and 2 made of Ru and the piezoelectric membrane 3 made of AlN in this method. FIGS. 3A through 3N show fabrication steps of the film bulk acoustic resonator of the embodiment.

At first, as shown in FIG. 3A, Ru is formed as the lower electrode 2 on the Si substrate 5. Here, the substrate 5 may be a glass substrate, a quartz substrate or a substrate on which another semiconductor device has been formed, beside the Si substrate. Still more, the lower electrode 2 may be Mo, W, Rh, Ir and Pt whose acoustic impedance is large, beside Ru.

Figure 3B:
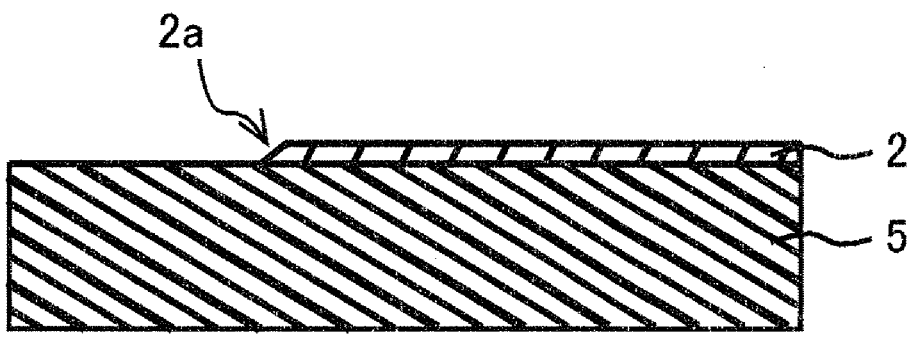

Next, the lower electrode 2 having the tapered end 2a is formed by removing part of the Ru film as shown in FIG. 3B.

Figure 3C:
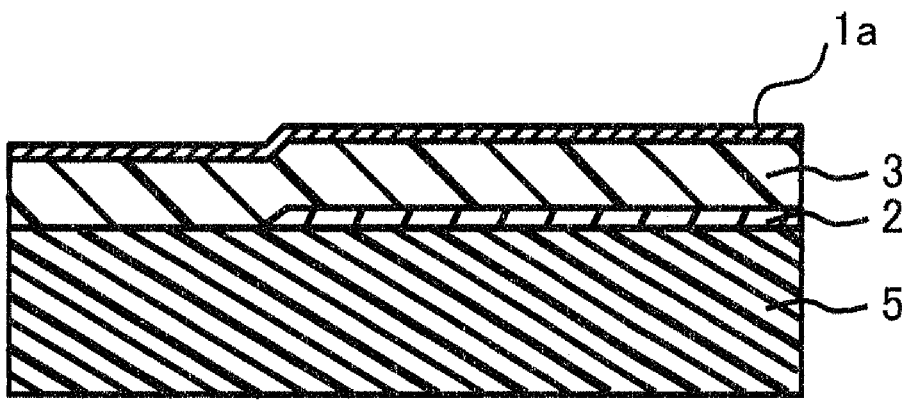

Next, the piezoelectric membrane 3 made of AlN is formed on the lower electrode 2 and the substrate 5 as shown in FIG. 3C. At this time, a part 1a of the upper electrode 1 may be formed for the purpose of protecting the surface of the AlN on AlN (the part 1a of the upper electrode 1 is formed in the present embodiment).

Figure 3D:
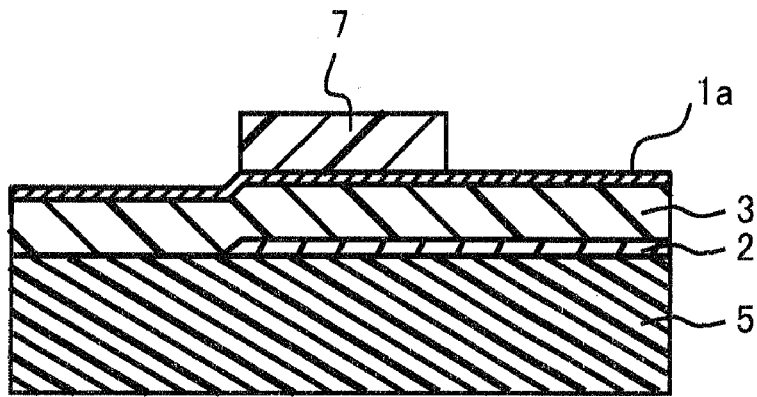

Next, a resist pattern 7 having a desirable pattern is formed on the part 1a of the upper electrode 1 for the purpose of removing AlN of the non-resonating section R2 as shown in FIG. 3D.

Figure 3E:
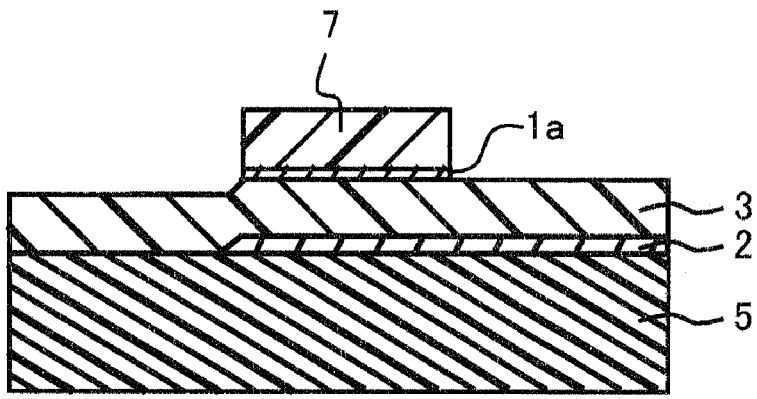

Next, the part 1a of the upper electrode 1 formed as the AlN surface protecting film is etched by the resist pattern as shown in FIG. 3E.

Figure 3F:
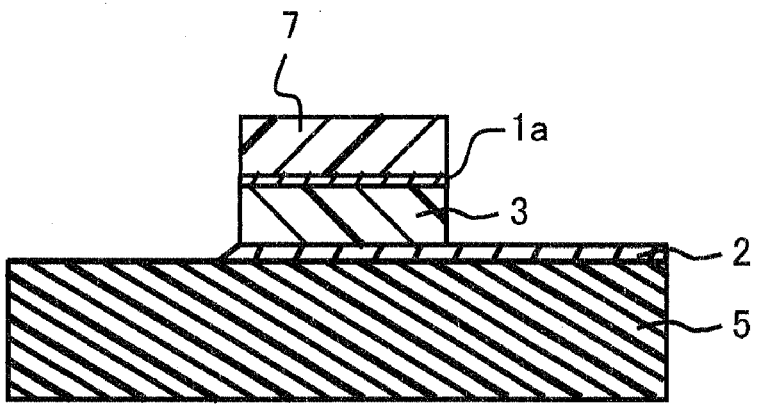
Figure 3G:
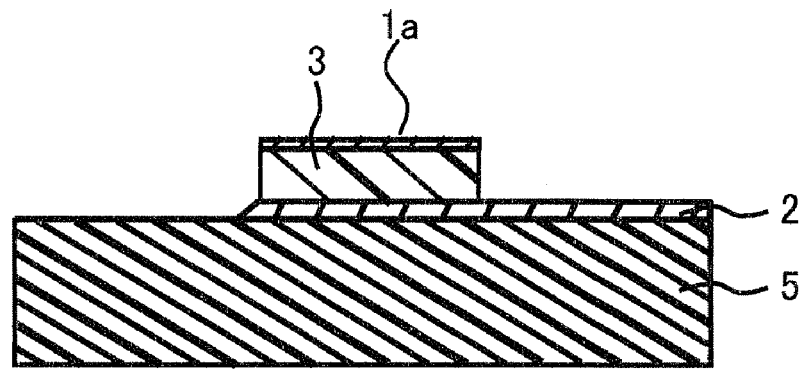

Next, AlN (the piezoelectric membrane 3) in the non-resonating section R2 is etched as shown in FIG. 3F. Thereby, the resist pattern 7 is also removed as shown in FIG. 3G, bringing about a state in which the lower electrode 2, the piezoelectric membrane 3 and the part 1a of the upper electrode 1 are formed on the substrate 5.

Figure 3H:
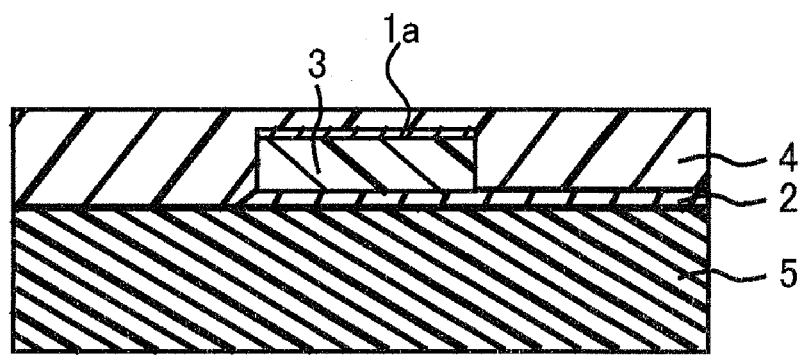

Next, $SiO_2$ as the insulating film 4 is formed around AlN (the piezoelectric membrane 3) by using the method of SOG (Spin-On Glass) as shown in FIG. 3H. Here, although the method for forming the insulating film 4 is desirable to be the application by the SOG described above in terms of the fabrication cost, other methods such as sputtering, evaporation, CVD (chemical Vapor Deposition) and others may be used other than that.

Figure 3I:
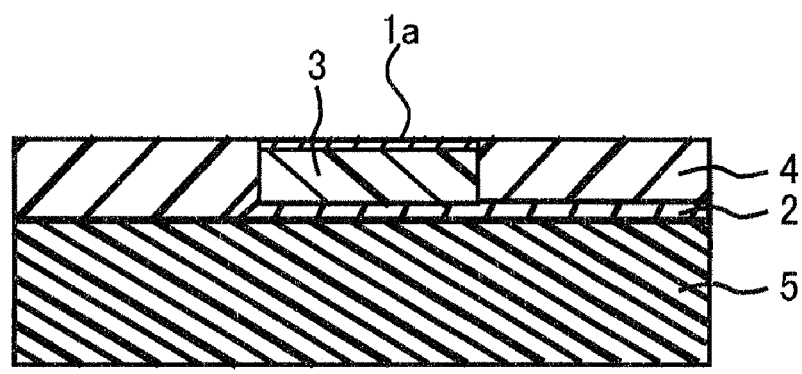
Figure 3J:
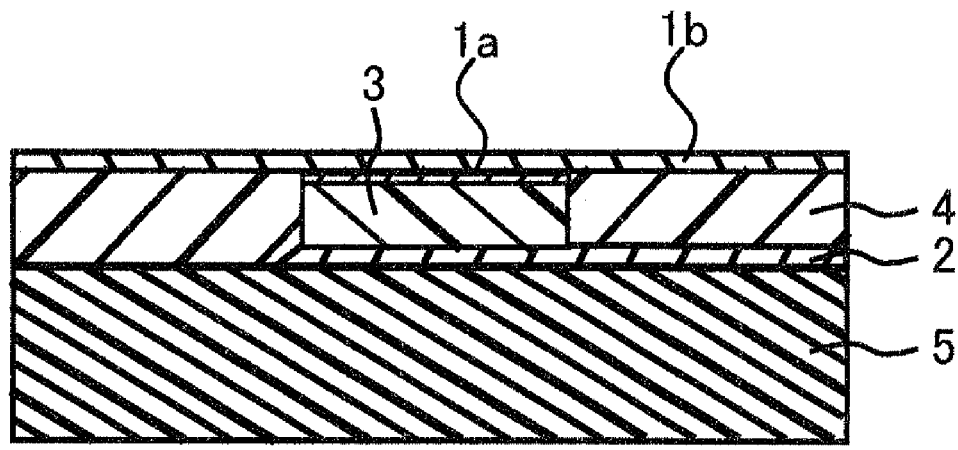

Next, the SOG (the insulating film 4) applied on the resonating section R1 is removed and flattening treatment is carried out for the purpose of reducing a difference of surface step between AlN (the piezoelectric membrane 3) and the insulating film 4 around that as shown in FIG. 3I. Here, the flattening treatment is carried out by means of etching back, grinding, CMP (Chemical Mechanical Polishing) and others. Here, it is possible to prevent the upper electrode 1 from being disconnected by reducing the difference of surface step to be less than the thickness of the upper electrode 1. The AlN surface protecting film (the part 1a of the upper electrode 1) may be removed at this time.

Next, Ru is formed as an upper electrode 1b as shown in FIG. 33. Here, the upper electrode 1b may be formed of Mo, W, Rh, Ir and Pt whose acoustic impedance is large other than Ru.

Figure 3K:
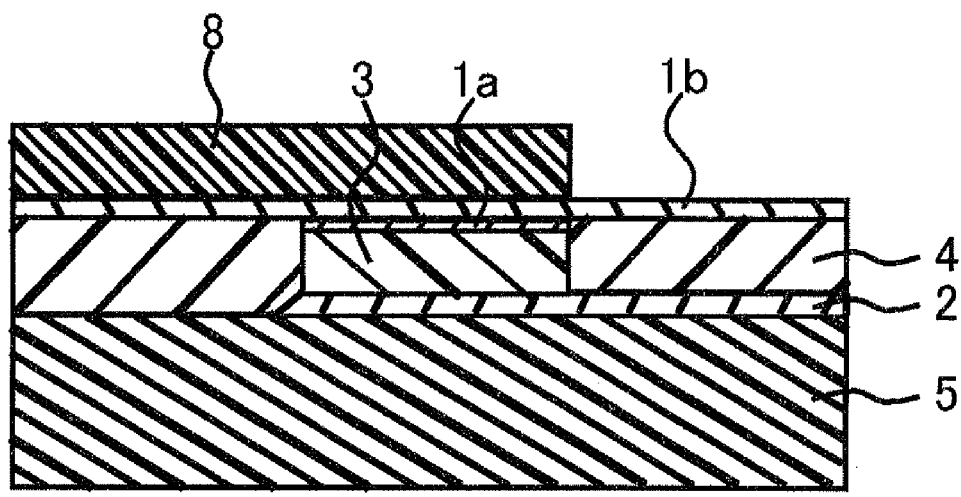

Next, a resist pattern 8 is formed on the upper electrode 1b as shown in FIG. 3K.

Figure 3L:
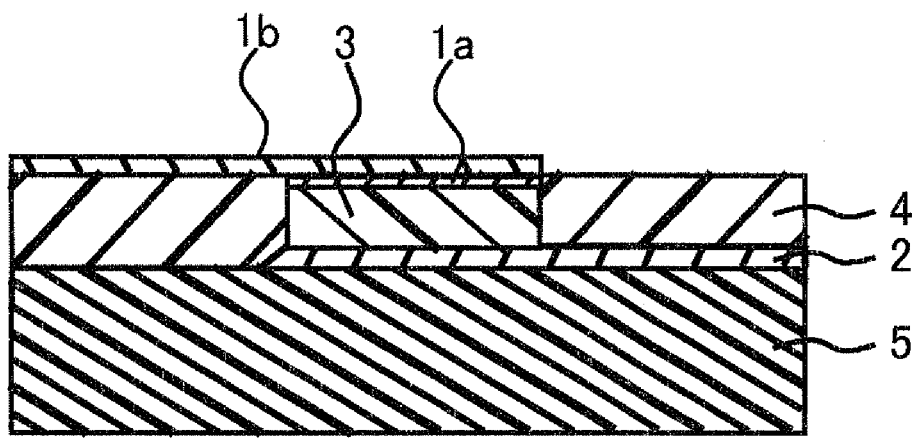

Next, the resist pattern 8 is etched to remove the upper electrode 1b on the non-resonating section R2 as shown in FIG. 3L.

Figure 3M:
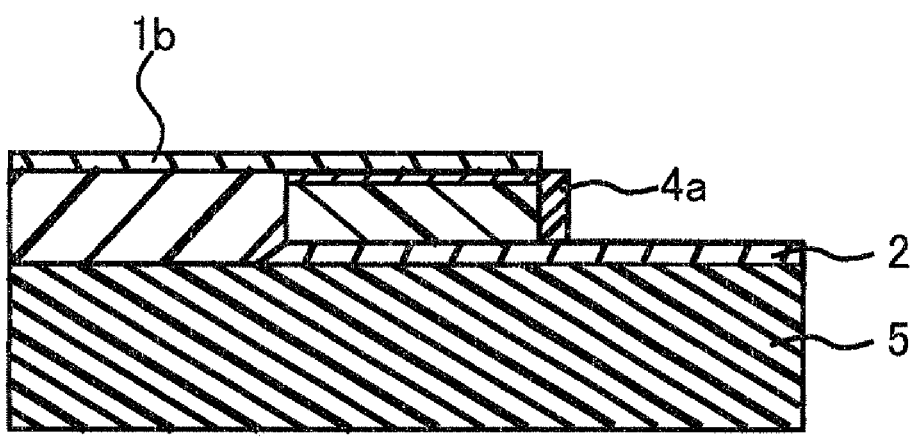
Figure 3N:
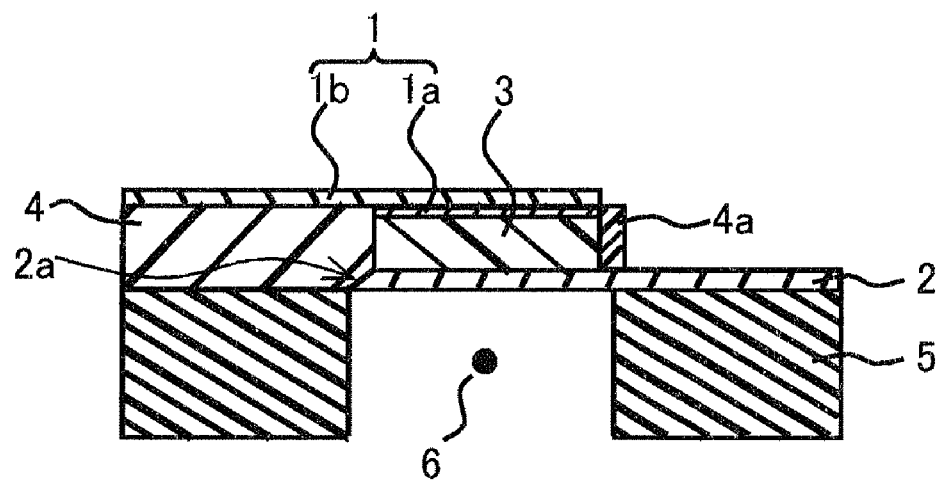

Next, the SOG (the insulating film 4) on the side of the lower electrode 2 is removed to obtain electrical connection with the lower electrode 2 as shown in FIG. 3M. It is noted that although all of the SOG (the insulating film) on the side of the lower electrode 2 may be removed in this step, a part 4a of the insulating film 4 may be left as shown in FIG. 3M. It is possible to reinforce the lower electrode 2 and to prevent the lower electrode 2 from being damaged in forming the void 6 by thus leaving the part 4a of the insulating film 4.

Finally, the void 6 is formed right under the resonating section R1 (see FIG. 2B) as shown in FIG. 3N. The void 6 may be formed by etching from the back of the substrate 5 by using Deep Reactive Ion Etching (DRIE). Here, beside the method described above, there is a method of forming a concave in the substrate 5, then filling a sacrificing layer in the concave and removing the sacrificing layer in the end as a method for fabricating the void 6. There is also a method of forming a sacrificing layer pattern on the substrate 5 and of removing the sacrificing layer in the end. Still more, although the configuration of forming the void 6 has been shown in the present embodiment, a configuration of using an acoustic mirror may be adopted and another configuration may be adopted as far as the configuration can realize at least the acoustic wave resonator.

Resonance Q (quality factor), anti-resonance Q and electromechanical coupling coefficient k2 of the film bulk acoustic resonator fabricated by the method of the present embodiment are shown in the column of $SiO_2$ in (Table 1) described above. As it is apparent when compared with AlN in (Table 1), while a value of the anti-resonance Q is 400 when the AlN is formed in the non-resonating section R2, it was confirmed that the value of the anti-resonance Q is improved to 865 by adopting the configuration of removing the AlN of the non-resonating section R2 and of forming the insulating film 4 of $SiO_2$ around the AlN of the resonating section R1 like the present embodiment. Similarly to that, it was confirmed that the value of the electromechanical coupling factors k2 is improved from 6.15% to 6.33%.

3. Comparison of the Present Embodiment with the Prior Art

Figure 4A:
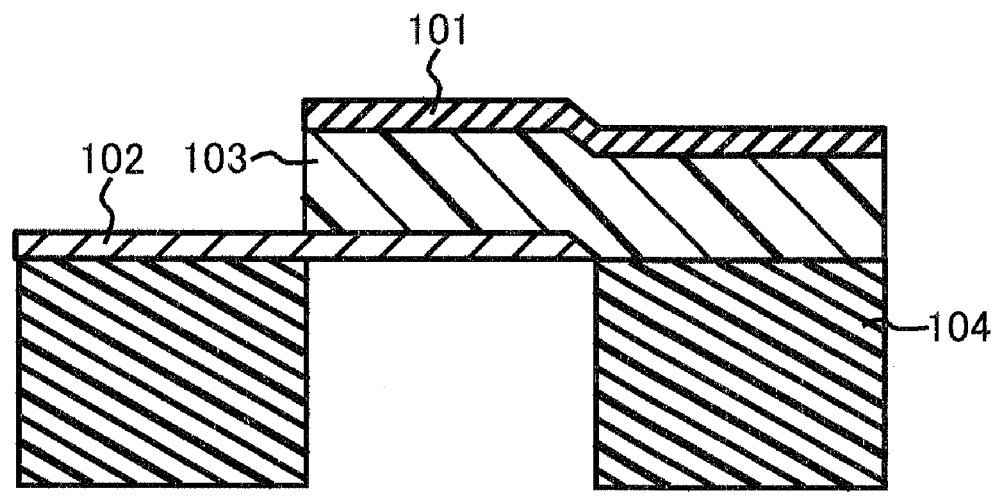
FIGS. 4A to 4E show individual schematic structures of film bulk acoustic resonators for purposes of comparing characteristics with the film bulk acoustic resonator according to the present embodiment.
Figure 4B:
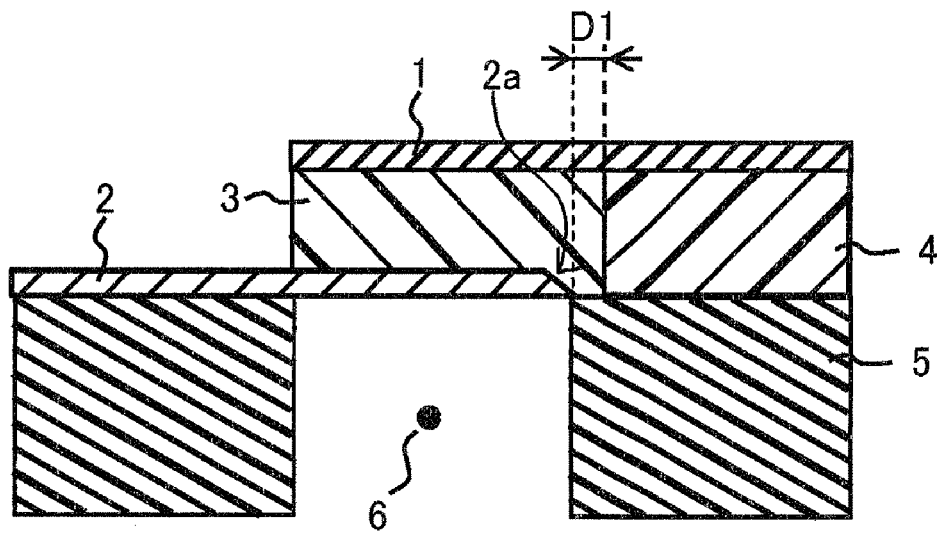
Figure 4C:
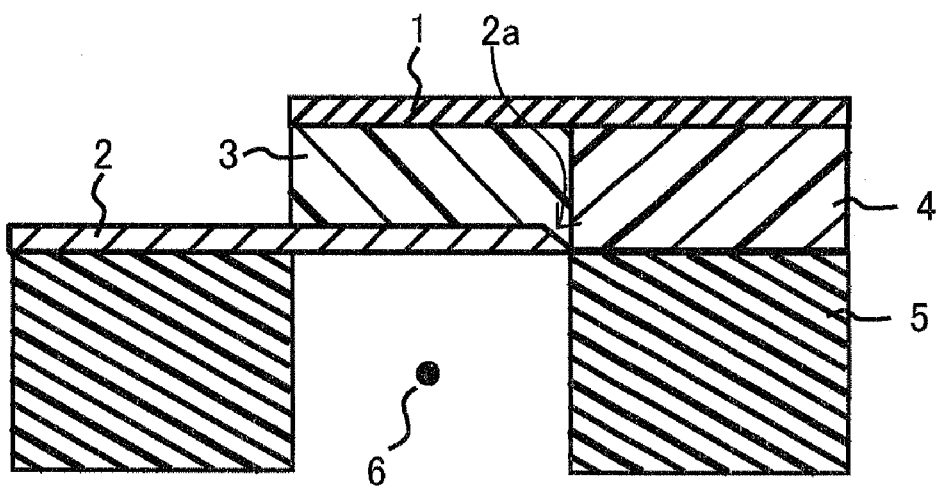
Figure 4D:
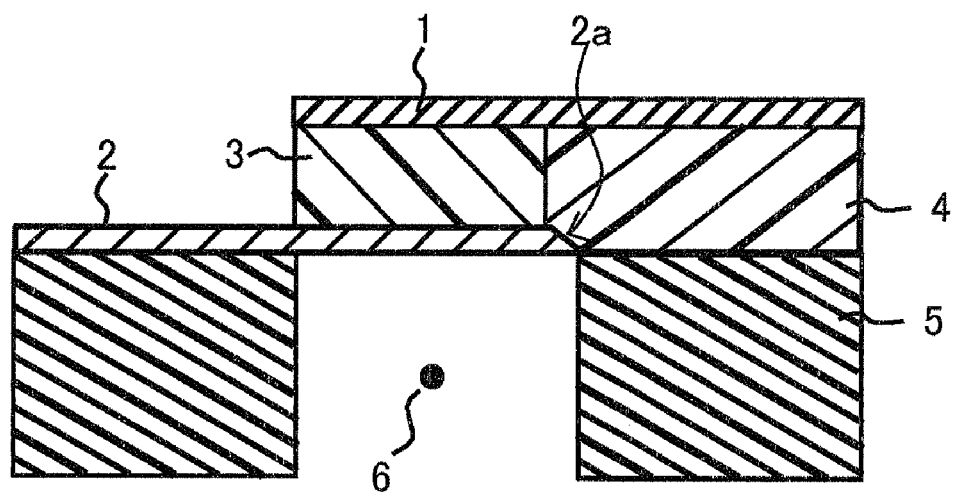
Figure 4E:
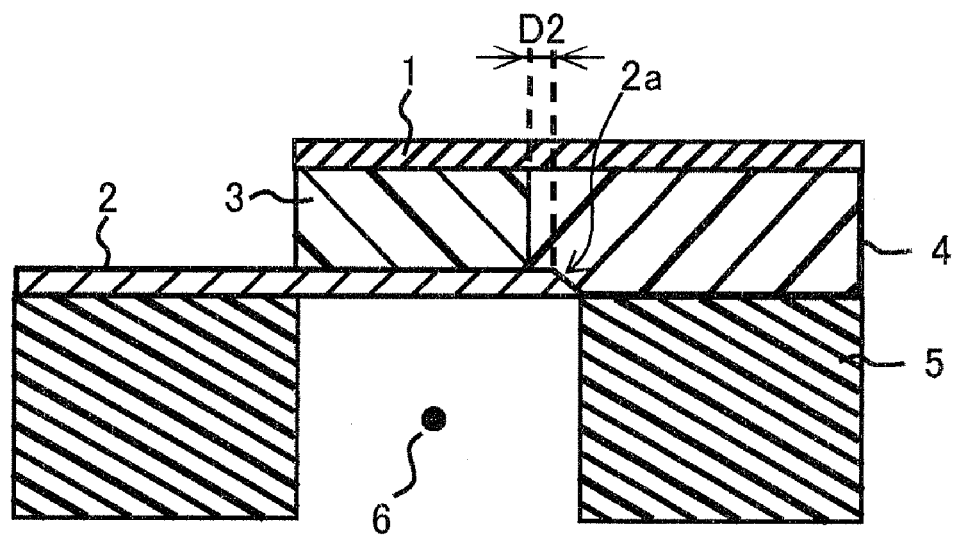

FIG. 4A shows a structure of the prior art in which no insulating film 4 is formed. FIG. 4B shows a structure of forming the insulating film 4 composed of $SiO_2$ and of forming a region of the piezoelectric membrane 3 corresponding to a distance D1 between the lower end of the tapered end 2a and the end of the insulating film 4. FIG. 4C shows a structure in which the position of the lower end of the tapered end 2a coincides with that of the end of the insulating film 4. FIG. 4D shows a structure in which the position of the upper end of the tapered end 2a coincides with that of the end of the insulating film 4. FIG. 4E shows a structure in which the insulating film 4 is formed on the tapered end 2a and having a distance D2 between the upper end of the tapered end 2a and the end of the insulating film 4. It is noted that in the structures shown in FIGS. 4A through 4E, the lower end of the tapered end 2a coincides with the position of an edge of the void 6. Further, the distances D1 and D2 are 2 µm in both cases in the present embodiment.

Table 2 shows each characteristic of the film bulk acoustic resonators shown in FIGS. 4A to 4E which are fabricated by the method shown in the embodiment. In other words, the Table 2 shows each characteristic of the resonators which have individual structures different in the regions where the insulating films 4 are formed, while each resonator has the tapered end 2a at the end of the lower electrode 2.

TABLE 2

| Structure of the film bulk acoustic resonator | Resonance Q | Anti-resonance Q | Electro-mechanical coupling coefficient k2 (%) |
|---|---|---|---|
| Shown in FIG. 4A | 740 | 396 | 6.16 |
| Shown in FIG. 4B | 740 | 396 | 6.16 |
| Shown in FIG. 4C | 715 | 337 | 6.21 |
| Shown in FIG. 4D | 740 | 921 | 6.30 |
| Shown in FIG. 4E | 740 | 729 | 6.21 |

It was confirmed that the film bulk acoustic resonators having the structures shown in FIGS. 4D and 4E are improved in the anti-resonance Q and electro-mechanical coupling coefficients k2 as compared to the film bulk acoustic resonators individually shown in FIGS. 4A to 4C. The resonator shown in FIG. 4A has no insulating film 4, and the resonators shown in FIGS. 4B and 4C have such structures that each of the boundaries between the piezoelectric membranes 3 and the insulating films 4 is disposed on the lower end of the tapered end 2a or the outside of the lower electrode 2. On the other hand, the resonators shown in FIGS. 4D and 4E have structures in which each of the boundaries is disposed on the upper end of the tapered end 2a or the inside of the lower electrode 2 (from the upper end of the tapered end 2a to the center of the upper surface of the lower electrode 2). In addition to the disposition of the boundaries, the resonators shown in FIGS. 4D and 4E are fabricated by the method of steps of; removing the piezoelectric membrane 3 other that at the position sandwiched by the upper and lower electrodes 1 and 2; and forming the insulating film 4 in the non-resonating section R2 from which the piezoelectric membrane 3 has been removed; and the part of the boundary of the piezoelectric membrane 3 and the insulating film 4 is formed at the upper end or the inside thereof.

4. Configuration of Filter and Duplexer

Figure 5:
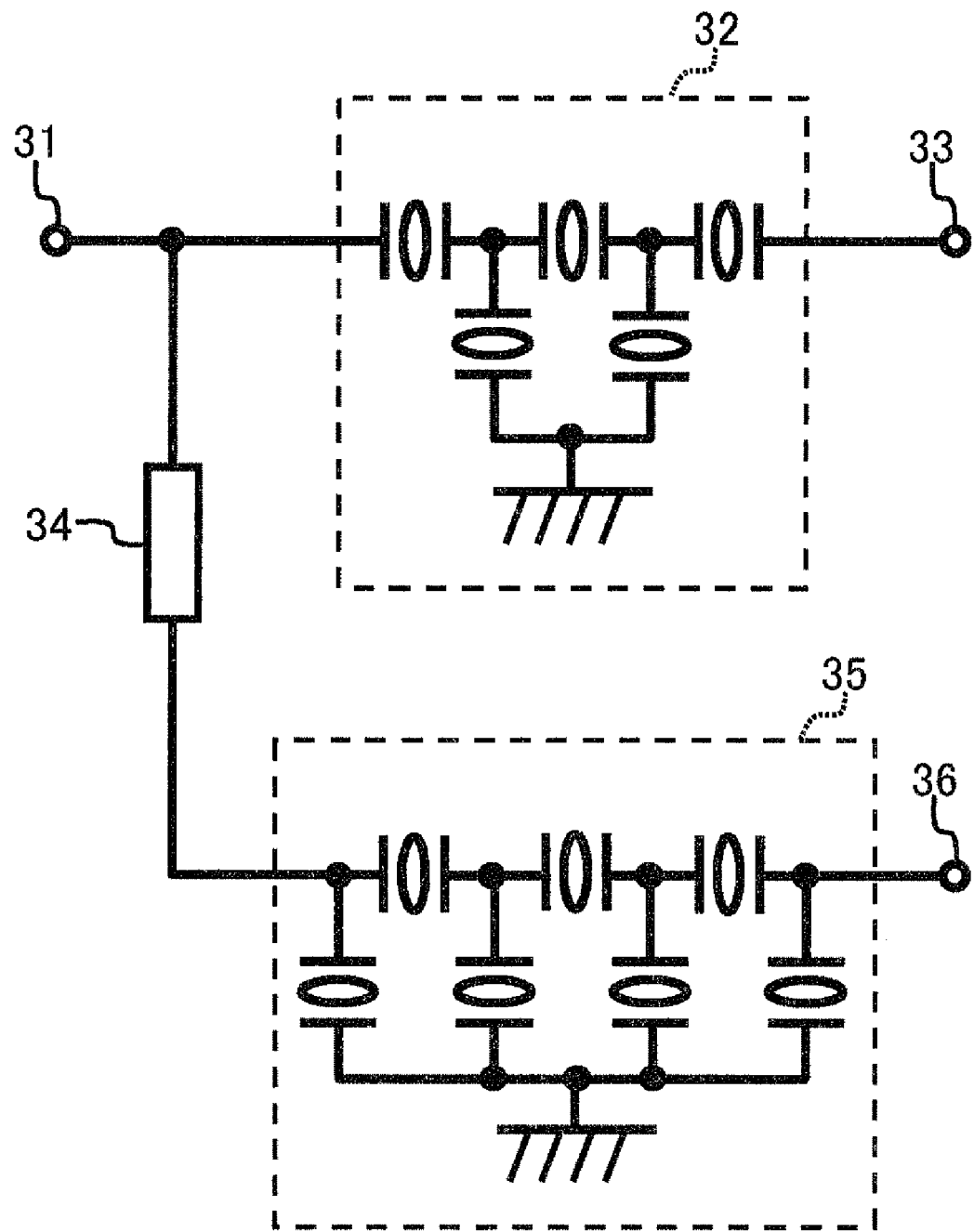
FIG. 5 shows a schematic circuit diagram of a duplexer using the film bulk acoustic resonator according to the embodiments.

FIG. 5 shows a circuit diagram of a duplexer using the film bulk acoustic resonator of the embodiment. As shown in FIG. 5, the duplexer has a terminal 31 to be connected to an antenna (not shown), a receiving filter 32 composed of a ladder-type filter, an output terminal 33 to be connected to a receiving circuit (not shown), a phase matching circuit 34 for matching impedance of the receiving and transmitting sides, a transmitting filter 35 composed of a ladder type filter and an input terminal 36 to be connected to a transmitting circuit (not shown). The receiving filter 32 and the transmitting filter 35 are composed of the ladder-type filters formed of the film bulk acoustic resonators of the embodiment.

Figure 6:
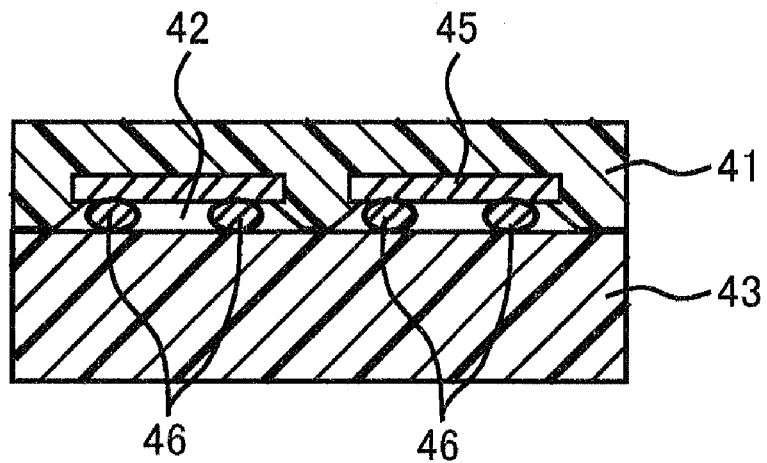
FIG. 6 shows a schematic cross-sectional diagram of a chip structure including filter elements component according to the embodiments.

FIG. 6 shows an embodiment of the duplexer. In FIG. 6, the duplexer has a structure in which a transmitting filter element 42 and a receiving filter element 45 are mounted in a manner of facedown on a mounting substrate 43. The mounting substrate 43 is provided with wires, a phase shifter and an output terminal (which is not shown) built therein. The mounting substrate 43 is electrically connected with the transmitting filter element 42 and the mounting substrate 43 through bumps 46. The receiving filter element 45 and the transmitting filter element 42 are formed respectively as individual chips.

Because the value Q of the film bulk acoustic resonator of the embodiment is high, it becomes possible to realize a small and high performance duplexer when the duplexer is constructed by using the film bulk acoustic resonator of the embodiment.

Although the receiving filter 32 and the transmitting filter 35 are configured by using the film bulk acoustic resonator in the present embodiment, a configuration of connecting the film bulk acoustic resonator filter to the transmitting side and the surface acoustic wave to the receiving side may be adopted. Further, although the configuration in which the transmitting filter element 42 and the receiving filter element 45 are mounted in the manner of face-down and are concealed by a resin material is adopted in FIG. 6, they may be also configured so as to be wire-mounted and are hermetically concealed. Still more, instead of the duplexer in which one transmitting filter device 42 and one receiving filter device 45 are mounted on the mounting substrate 43 according to the embodiment, it is possible to adopt a configuration in which a plurality of duplexers is formed by mounting a plurality of transmitting filters and a plurality of receiving filters on a single substrate. In this case, a duplexer adaptive to a multi-mode or multi-band portable phone may be realized by using a semiconductor switch.

5. Configuration of Communication Module

Figure 7:
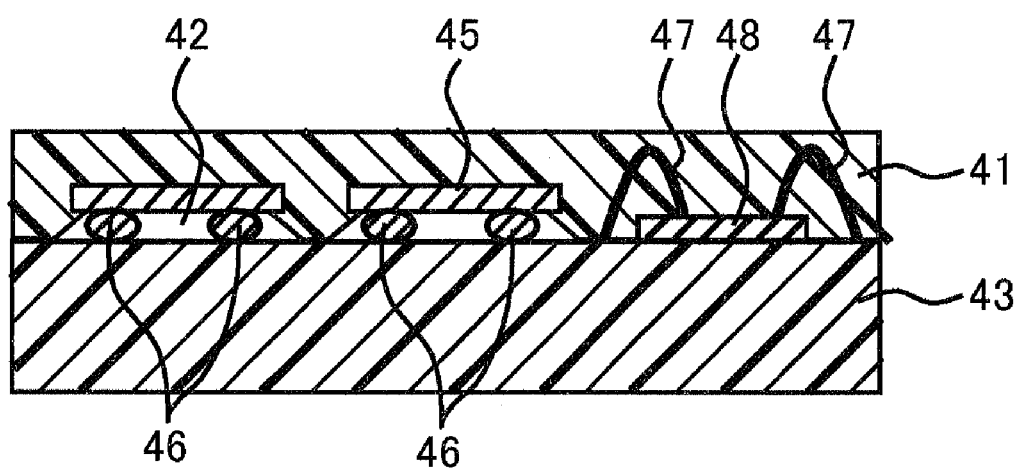
FIG. 7 shows a schematic cross-sectional diagram of a chip structure including filter elements component according to the embodiments.

FIG. 7 shows a communication module including the film bulk acoustic resonator s according to the embodiment. The communication module includes the receiving filter element 45 and the transmitting filter element 42 which comprises the ladder-type filters using the film bulk acoustic resonators according to the embodiment. The receiving and the transmitting filter elements 45 and 42 as individual chips are mounted on the mounting substrate 43 in the manner of facedown. A semiconductor device 48 and the mounting substrate 43 are wired by using wires 47. On the mounting substrate 43, one or more wires, phase shifters and output terminals, which are not shown, are implemented. The mounting substrate 43 is electrically connected with the transmitting filter element 42 and the receiving filter element 45 through bumps 46. The semiconductor device 48 is electrically connected with the transmitting filter element 42 and the receiving filter element 45 through the wires included in the mounting substrate 43. The mounting substrate 43 is molded by a resin material 41 so as to cover the transmitting filter element 42, the receiving filter element 45 and the semiconductor device 48.

The communication module in which the duplexer shown in FIG. 5 and the semiconductor device 48 are mounted on the same substrate may be realized by constructing as described above.

Noted that it is preferable to construct the semiconductor device 48 by a low noise amplifier as one example. Beside that, as the semiconductor device 48 may be composed with switch elements, a communication module accommodating to multi-modes may be constructed by mounting a plurality of transmitting filters, a plurality of receiving filters and a semiconductor switch on one substrate.

Figure 8:
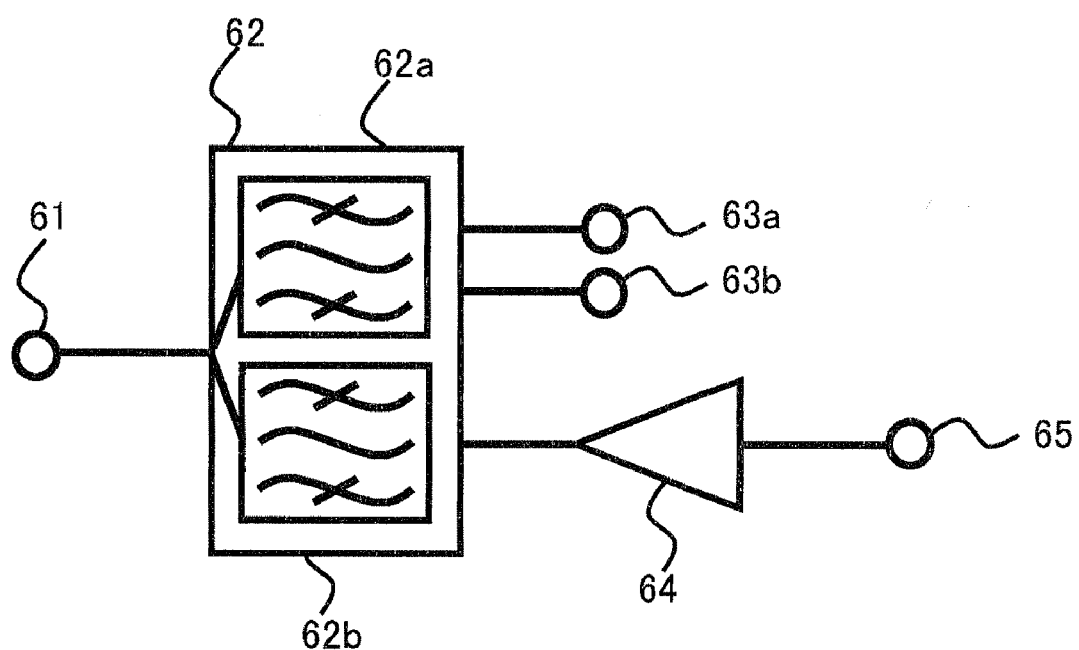
FIG. 8 shows a schematic circuit diagram of a communication module including the film bulk acoustic resonator according to the embodiments.

FIG. 8 shows one exemplary communication module having the film bulk acoustic resonator according to the embodiment. As shown in FIG. 8, a duplexer 62 includes a receiving filter 62a and a transmitting filter 62b. The receiving filter 62a is connected with receiving terminals 63a and 63b accommodating to balanced output. The transmitting filter 62b is connected to a transmitting terminal 65 via a power amplifier 64. The receiving filter 62a and the transmitting filter 62b include the film bulk acoustic resonator of the embodiment or a band-pass filter having the film bulk acoustic resonator.

In receiving signals, the receiving filter 62a passes only signals in a predetermined frequency band among the signals inputted via an antenna terminal 61 and outputs to the outside from the receiving terminals 63a and 63b. In transmitting signals, the transmitting filter 62b passes only signals in a predetermined frequency band among the signals inputted from a transmitting terminal 65 and amplified by the power amplifier 64 and outputs to the outside from the antenna terminal 61.

The communication module that excels in the receiving and transmitting characteristics and is downsized may be realized by forming the communication module having the filter including at least one film bulk acoustic resonator of the embodiment as described above.

The configuration of the communication module shown in FIG. 8 is one example and the similar advantage may be obtained by a communication module of another type including the film bulk acoustic resonator or the band-pass filter according to the embodiment.

5. Configuration of Communication Device

Figure 9:
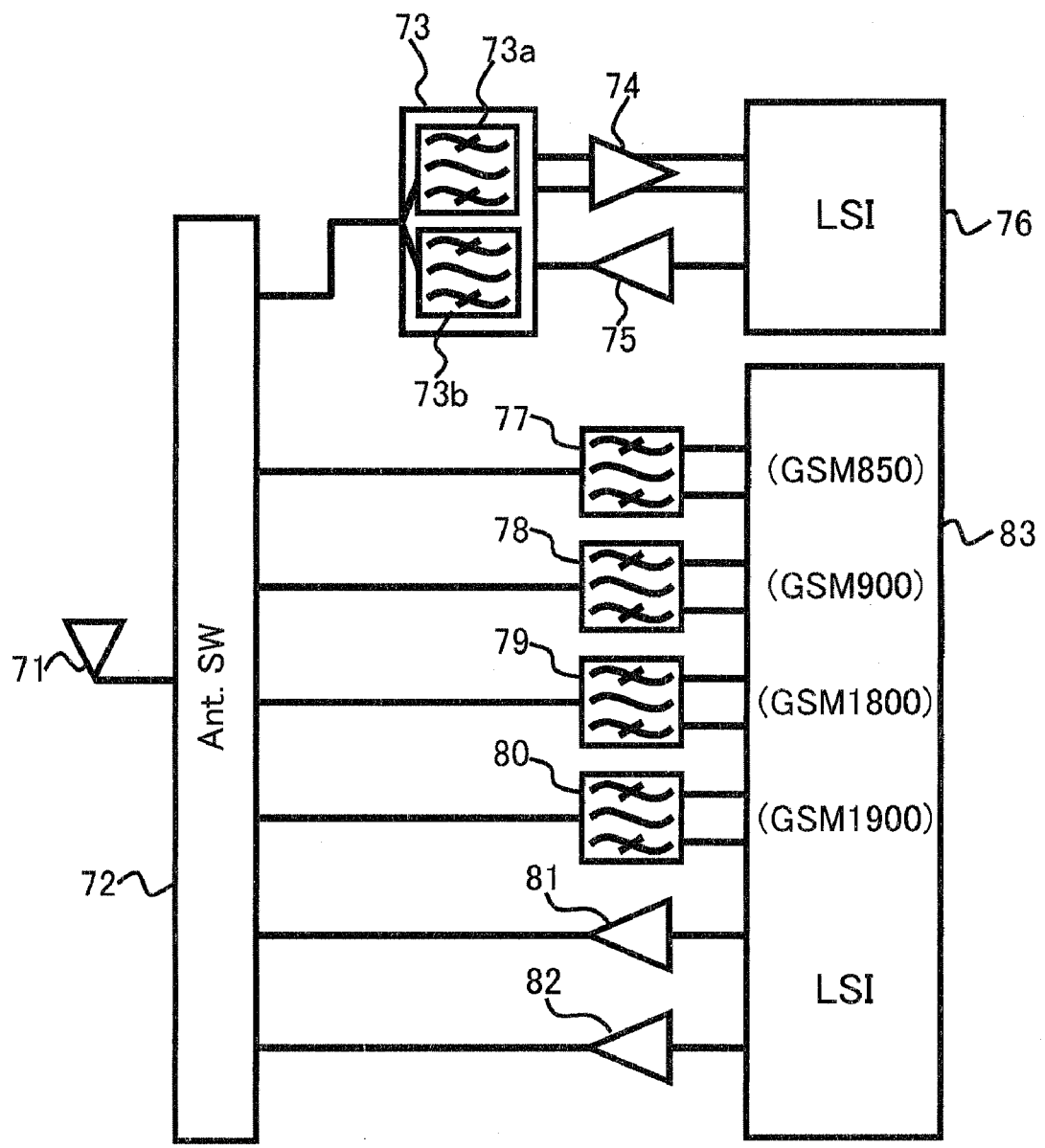
FIG. 9 shows a schematic diagram of a communication device.

FIG. 9 shows a radio frequency (RF) block of a mobile-phone unit as one exemplary communication device including the film bulk acoustic resonator according to the embodiment. The configuration shown in FIG. 9 is that of a mobile-phone unit conforming to the transmission method such as the Global System for Mobile Communications (GSM) and the Wideband Code Division Multiple Access (W-CDMA). The GSM communication system in the present embodiment corresponds to 850 MHz, 950 MHz, 1.8 GHz and 1.9 GHz bands. Still more, although the mobile-phone unit has a microphone, a speaker, a liquid crystal display and others other than the structures shown in FIG. 9, they are not shown because they are unnecessary for the explanation of the present embodiment. Here, the receiving filters 73a, 77, 78, 79 and 80 and a transmitting filter 73b include the film bulk acoustic resonators according to the embodiment.

At first, an antenna switching circuit 72 selects a Large Scale Integration (LSI) to be operated depending on whether a communication system of a receiving signal inputted via an antenna 71 is the W-CDMA or the GSM. When the inputted receiving signal conforms to the W-CDMA communication system, the circuit 72 switches so as to output the receiving signal to a duplexer 73. The receiving signal inputted to the duplexer 73 is limited to a predetermined frequency band by the receiving filter 73a and outputted to a low noise amplifier (LNA) 74 as a balanced receiving signal. Then, the LNA 74 amplifies the balanced receiving signal and outputs the balanced receiving signal amplified to a LSI 76. LSI 76 demodulates the balanced receiving signal amplified by LNA 74 into sound signals or controls operations of each section within the mobile-phone unit.

In contrary, when transmitting signal, the LSI 76 generates a transmitting signal. The generated transmitting signal is amplified by a power amplifier 75 and is inputted to the transmitting filter 73b. The transmitting filter 73b passes only signals in a predetermined frequency band among the inputted transmitting signals. Signals passed through the transmitting filter 73b subsequently are transmitted to the outside from the antenna 71 via the antenna switching circuit 72.

When the inputted receiving signal is a signal conforming to the GSM communication system, the antenna switching circuit 72 selects either one of the receiving filters 77 through 80 corresponding to a frequency band and outputs the receiving signal. The receiving signal whose band is limited by either one among the receiving filters 77 through 80 is inputted to a LSI 83. Based on the inputted receiving signal, the LSI 83 performs the process for demodulating into sound signals or controls operations of each section within the mobilephone unit. When a signal is to be transmitted in contrary, the LSI 83 generates a transmitting signal. The generated transmitting signal is amplified by a power amplifier 81 or 82 and is outputted to the outside from the antenna 71 via the antenna switching circuit 72.

As described above, the communication device that excels in the receiving and transmitting characteristics and is downsized may be realized by including the film bulk acoustic resonator of the embodiment in the communication device.

6. Others of Embodiments

According to the film bulk acoustic resonator according to the embodiments, it becomes possible to suppress acoustic waves leaking in the horizontal direction from the piezoelectric membrane 3 and to lower the loss by forming the insulating film 4 between the upper electrode 1 and the substrate 5 in the non-resonating section R2. The filter that excels in the pass-band characteristics may be also realized by adopting such film bulk acoustic resonator to various filters such as a band-pass filter. Still more, the receiving and transmitting characteristics may be improved and the size may be reduced by adopting such film bulk acoustic resonator to the duplexers, communication modules and communication devices.

What is claimed is:

1. A film bulk acoustic resonator comprising:
a substrate;
a lower electrode formed on the substrate;
a piezoelectric membrane formed on the lower electrode;
an upper electrode formed on the piezoelectric membrane; and
an insulating film disposed adjacent to the piezoelectric membrane between the upper electrode and the substrate and at a position at which the upper electrode and the substrate are opposed each other.
wherein an area of contact between the piezoelectric membrane and one of the upper electrode and the lower electrode is smaller than an area of a portion common between individual shapes of the upper electrode and the lower electrode projected on a plane including a surface of the substrate, the lower electrode formed on the surface.

2. A film bulk acoustic resonator comprising:
a substrate;
a lower electrode formed on the substrate;
a piezoelectric membrane formed on the lower electrode;
an upper electrode formed on the piezoelectric membrane; and
an insulating film disposed adjacent to the piezoelectric membrane between the upper electrode and the substrate and at a position at which the upper electrode and the substrate are opposed each other.
wherein the substrate is formed so as to form a void at a portion facing to the lower electrode, and an area of contact between the piezoelectric membrane and one of the upper electrode and the lower electrode is smaller than an area at which the lower electrode faces the void.

3. A film bulk acoustic resonator comprising:
a substrate;
a lower electrode formed on the substrate;
a piezoelectric membrane formed on the lower electrode;
an upper electrode formed on the piezoelectric membrane; and
an insulating film disposed adjacent to the piezoelectric membrane between the upper electrode and the substrate and at a position at which the upper electrode and the substrate are opposed each other.
wherein the lower electrode has a tapered end and a part of the boundary between the piezoelectric membrane and the insulating film is disposed on an inside from an upper end of the tapered end.

4. The film bulk acoustic resonator according to claim 3, wherein a difference in thickness between the piezoelectric membrane and the insulating film is smaller than a thickness of the upper electrode.

5. The film bulk acoustic resonator according to claim 3, wherein the insulating film is composed of one of silicon oxide, silicon nitride, silicon carbide, and aluminum oxide.

6. The film bulk acoustic resonator according to claim 3, wherein the insulating film is formed from silicon oxide applied on the substrate using a method of spin on glass.

7. The film bulk acoustic resonator according to claim 3, wherein the piezoelectric membrane is composed of aluminum nitride as a main ingredient.

8. The film bulk acoustic resonator according to claim 3, wherein a shape of a portion at which the piezoelectric membrane contacts one of the upper electrode and the lower electrode is an ellipse.

9. The film bulk acoustic resonator according to claim 3, wherein a shape of a portion at which the piezoelectric membrane contacts one of the upper electrode and the lower electrode is a polygon, anyone of a plurality of edges composing the polygon is nonparallel with another of the edges.

10. The film bulk acoustic resonator according to claim 3, wherein a part of the upper electrode and the lower electrode is composed of a material including of one of molybdenum, tungsten, ruthenium, rhodium, iridium and platinum as a main ingredient.

11. A filter comprising:
a the film bulk acoustic resonator according to one of claims 3, 1, and 2.

12. A duplexer comprising: the film bulk acoustic resonator according to one of claims 3, 1, and 2.

13. A transmission module for communications comprising the duplexer according to claim 12.

14. A transmission module for communications including either or both of a filter and a duplexer each comprising the film bulk acoustic resonator according to one of claims 3, 1, and 2.

15. The transmission module according to claim 14, further comprising:
a semiconductor device; and
a substrate on which the semiconductor device and either or both of the filter and the duplexer are mounted.

* * * * *